United States Patent
Zhai et al.

(10) Patent No.: US 9,874,599 B2
(45) Date of Patent: Jan. 23, 2018

(54) DC-DC DEVICE SOLDERING DETECTING APPARATUS AND METHOD USING THE SAME

(71) Applicants: BOE TECHNOLOGY GROUP CO., LTD., Beijing (CN); BOE (HEBEI) MOBILE DISPLAY TECHNOLOGY CO., LTD., Hebei (CN)

(72) Inventors: Wenkai Zhai, Beijing (CN); Litao Fan, Beijing (CN); Tianxiao Zhao, Beijing (CN); Ruifeng Yang, Beijing (CN)

(73) Assignees: BOE TECHNOLOGY GROUP CO., LTD., Beijing (CN); BOE (HEBEI) MOBILE DISPLAY TECHNOLOGY CO., LTD., Gu'an Hebei (CN)

( * ) Notice: Subject to any disclaimer, the term of this patent is extended or adjusted under 35 U.S.C. 154(b) by 553 days.

(21) Appl. No.: 14/444,472

(22) Filed: Jul. 28, 2014

(65) Prior Publication Data
US 2015/0253377 A1    Sep. 10, 2015

(30) Foreign Application Priority Data
Mar. 6, 2014    (CN) .......................... 2014 1 0080740

(51) Int. Cl.
*G01R 31/08*    (2006.01)
*G01R 31/28*    (2006.01)
(Continued)

(52) U.S. Cl.
CPC ......... *G01R 31/2812* (2013.01); *G01R 31/00* (2013.01); *G01R 31/048* (2013.01);
(Continued)

(58) Field of Classification Search
CPC ........ G01R 31/08; G01R 31/10; G01R 31/28; G01R 19/16571; G01R 31/00; G01R 31/11
(Continued)

(56) References Cited

U.S. PATENT DOCUMENTS

| | | | | |
|---|---|---|---|---|
| 2003/0076232 | A1* | 4/2003 | Sato | H02M 7/00 340/679 |
| 2007/0018299 | A1* | 1/2007 | Koo | B82Y 10/00 257/686 |

(Continued)

FOREIGN PATENT DOCUMENTS

| | | |
|---|---|---|
| CN | 1610825 A | 4/2005 |
| CN | 101029918 A | 9/2007 |

(Continued)

OTHER PUBLICATIONS

Second Office Action regarding Chinese Application No. 201410080740.0, dated Jun. 20, 2016. Translation provided by Dragon Intellectual Property Law Firm.
(Continued)

*Primary Examiner* — Huy Q Phan
*Assistant Examiner* — Raul Rios Russo
(74) *Attorney, Agent, or Firm* — Harness, Dickey & Pierce, P.L.C.

(57) ABSTRACT

Embodiments of present invention provide a DC-DC device soldering detecting apparatus. The apparatus may include a power module adapted to input a preset voltage into the DC-DC device on a circuit board, a frequency generating module adapted to input a preset clock frequency signal into the DC-DC device, and a voltage detecting and determining module adapted to detect soldering quality of the DC-DC device on the circuit board based on an output voltage of the DC-DC device.

16 Claims, 5 Drawing Sheets

(51) Int. Cl.
  *G01R 31/10* (2006.01)
  *G01R 31/00* (2006.01)
  *G01R 31/11* (2006.01)
  *G01R 31/04* (2006.01)
  *G01R 19/165* (2006.01)
  *G01R 31/40* (2014.01)

(52) U.S. Cl.
  CPC .............. *G01R 31/08* (2013.01); *G01R 31/10* (2013.01); *G01R 31/11* (2013.01); *G01R 19/16571* (2013.01); *G01R 31/40* (2013.01)

(58) Field of Classification Search
  USPC ................. 324/500, 512, 522, 523, 527–533
  See application file for complete search history.

(56) References Cited

U.S. PATENT DOCUMENTS

2007/0095798 A1* 5/2007 Kraz ..................... B23K 3/047
                                                      219/85.1
2011/0163669 A1* 7/2011 Hasegawa .......... H05B 41/2855
                                                      315/76
2014/0265741 A1* 9/2014 Vrankovic ......... H02K 11/0094
                                                      310/68 C

FOREIGN PATENT DOCUMENTS

| | | |
|---|---|---|
| CN | 101144844 A | 3/2008 |
| CN | 102323298 A | 1/2012 |
| CN | 103278723 A | 9/2013 |

OTHER PUBLICATIONS

First Office Action regarding Chinese application No. 201410080740.0, dated Dec. 21, 2015. Translation provided by Dragon Intellectual Property Law Firm.
1,000 Questions for Automotive Electrotechnician (second edition). Chapter 9 Method for Detecting DC-DC Parameters.
Inspection Method on Solder Joint Quality in SMT.

* cited by examiner

DC-DC DEVICE SOLDERING DETECTING APPARATUS AND METHOD USING THE SAME

CROSS-REFERENCE TO RELATED APPLICATION

This application claims a priority of a Chinese Patent Application No. 201410080740.0 filed in China on Mar. 6, 2014, the disclosures of which are incorporated in their entirety by reference herein.

TECHNICAL FIELD

The present disclosure relates to the field of display, and in particular to a DC-DC device soldering detecting apparatus and a method using the same.

BACKGROUND

With constant development of display technology, the requirement for driving ability of a liquid crystal display (LCD) module driving circuit is more and more urgent, and more and more flexible printed circuits (FPCs) will be provided with a quad flat no-lead packaged (QFN) direct current to direct current (DC-DC) device.

However, since the DC-DC driving circuit has many subsidiary circuits which are distributed intensively, it is difficult to leave a detecting point on the FPC due to the limitation of the wiring space on the FPC, in addition to factors, such as less pitch of the QFN device, and limitations of process and procedure of surface mounted technology (SMT) of domestic-made FPC, the DC-DC device and the subsidiary circuit have undesirable conditions such as empty soldering and short circuit. In the conventional detecting method, the soldering state is determined and thus the faulty soldering is detected only by observing or automatic optic inspection (AOI) and detecting input/output resistance state of the FPC. However, in the conventional electrical detecting method, the input/output resistance state is detected when the whole FPC is not powered on, the soldering state of the subsidiary circuit of the DC-DC device can not be detected correctly, especially for the QFN devices, which have no leakage pin and thus on which manual electrical detection can not be performed.

SUMMARY

Technical Problem to be Solved

A technical problem to be solved by the disclosure is to provide a DC-DC device soldering detecting apparatus and a method using the same, for power-on detecting the faulty soldering of the DC-DC device in a powered on state which is caused by factors such as SMT technology and process.

Technical Solutions

To solve the above technical problem, it is provided a DC-DC device soldering detecting apparatus in a technical solution of the disclosure, and the soldering detecting apparatus includes:

a power module adapted to input a preset voltage into a DC-DC device on a circuit board;

a frequency generating module adapted to input a preset clock frequency signal into the DC-DC device; and a voltage detecting and determining module adapted to detect soldering quality of the DC-DC device on the circuit board based on an output voltage of the DC-DC device.

Further, the output voltage of the DC-DC device may be compared with a reference voltage by the voltage detecting and determining module, the voltage detecting and determining module determines that the DC-DC device is soldered normally if the output voltage is greater than the reference voltage, and the voltage detecting and determining module determines that the DC-DC device is soldered abnormally if the output voltage is not greater than the reference voltage.

Further, the power module may include a docking station detecting circuit and a voltage converting circuit, the docking station detecting circuit may be adapted to determine whether the soldering and positioning of the DC-DC device on the circuit board is correct based on a common ground signal of the circuit board, and send an ON-signal to the voltage converting circuit if the soldering and positioning of the DC-DC device on the circuit board is correct; and the voltage converting circuit may be adapted to input a preset voltage into the DC-DC device upon reception of the ON-signal, and control the frequency generating module and the voltage detecting and determining module to turn on.

Further, the docking station detecting circuit may include a first resistor, a second resistor, a third resistor, a fourth resistor, a first transistor and a second transistor, an end of the first resistor may be connected to a first end of the first transistor; the other end of the first resistor may be connected respectively to an end of the second resistor and an end of the fourth resistor; the other end of the second resistor may be connected to a gate electrode of the first transistor; a second end of the second transistor may be connected to the other end of the fourth resistor; a first end of the second transistor may be connected to an end of the third resistor; a gate electrode of the second transistor may be connected to a second end of the first transistor; and the other end of the third transistor may be grounded.

Further, the frequency generating module may include a timer, a fifth resistor, a sixth resistor, a first diode, a second diode, a first capacitor and a second capacitor, a grounding pin of the timer may be connected respectively to an end of the first capacitor and an end of the second capacitor, and then grounded; a triggering pin of the timer may be connected respectively to a threshold pin of the timer, a second end of the first diode, the other end of the second capacitor and a first end of the second diode; a resetting pin of the timer may be connected respectively to a powering pin of the timer, an end of the fifth resistor; a controlling pin of the timer and the other end of the first capacitor; a discharging pin of the timer may be connected respectively to the othe end of the fifth resistor and an end of the sixth resistor; and the other end of the sixth resistor may be connected to a second end of the second diode.

Further, the voltage detecting and determining module may include a seventh resistor, an eighth resistor and an operational amplifier, an end of the seventh resistor may be connected respectively to an end of the eighth resistor and an inverted inputting end of the operational amplifier; the other end of the seventh resistor may be connected to a positive power end of the operational amplifier; and the other end of the eighth resistor may be grounded.

Further, the power module may further include a delay circuit and a discharging circuit, the delay circuit may be adapted to provide a time delay when the docking station detecting circuit determines that the soldering and positioning of the DC-DC device on the circuit board is correct, and cause the circuit board and the DC-DC device to discharge with respect to the ground if the discharging circuit is controlled to turn on after the time delay is ended.

Further, the discharging circuit may include a ninth resistor, a tenth resistor and a metal-oxide-semiconductor field-effect transistor, an end of the ninth resistor may be connected to a gate electrode of the metal-oxide-semiconductor field-effect transistor; the other end of the ninth resistor may be connected to a source electrode of the metal-oxide-semiconductor field-effect transistor and then grounded; and a drain electrode of the metal-oxide-semiconductor field-effect transistor may be connected to an end of the tenth resistor.

Further, the DC-DC device soldering detecting apparatus may further include a first alarming module, the first alarming module may include a first LED light, which is turned on when the soldering and positioning of the DC-DC device on the circuit board is correct.

Further, the DC-DC device soldering detecting apparatus may further include a second alarming module, the second alarming module may include a second LED light and a third LED light, with the second LED light being turned on when the voltage detecting and determining module determines that the DC-DC device is soldered normally, and the third LED light being turned on when the voltage detecting and determining module determines that the DC-DC device is soldered abnormally.

The present disclosure also provides a DC-DC device soldering detecting method, comprising:

a voltage providing step adapted to input a preset voltage into a DC-DC device on a circuit board by using a power module;

a frequency signal providing step adapted to input a preset clock frequency signal into the DC-DC device by using a frequency generating module; and a voltage detecting and determining step adapted to detect soldering quality of the DC-DC device on the circuit board based on an output voltage of the DC-DC device by using a voltage detecting and determining module.

Benefit Effects

In the DC-DC device soldering detecting apparatus and the method using the same according to the disclosure, the DC-DC device is taken as a booster device, which when being inputted with the preset voltage and colck frequency signal, can output a corresponding voltage, and by comparing the output voltage of the DC-DC device and a reference voltage, it can be determined whether the DC-DC device operates normally, i.e., the soldering quality of the DC-DC device can be detected in the case where the circuit board is powered on, so as to detect the faulty soldering.

DETAILED DESCRIPTION

The embodiments of the present invention will be described hereinafter in conjunction with the drawings and examples. It should be appreciated that the following examples are merely used to illustrate the present invention, but shall not be used to limit the scope of the present invention.

Figure 1:
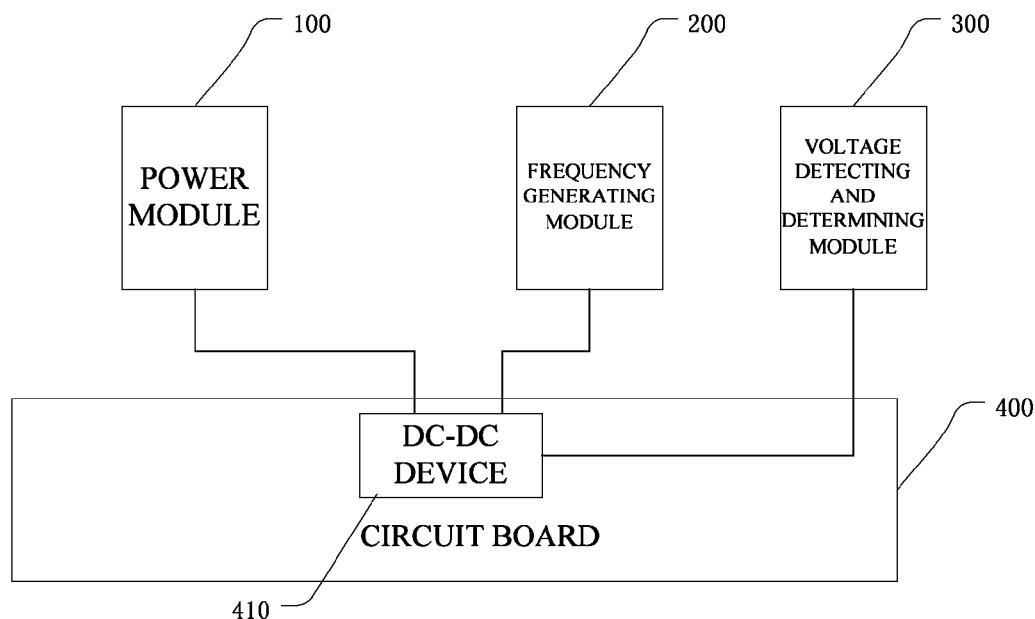
FIG. 1 is a schematic diagram of a DC-DC device soldering detecting apparatus according to an embodiment of the disclosure.

A schematic diagram of a DC-DC device soldering detecting apparatus according to an embodiment of the disclosure is shown in FIG. 1, and the soldering detecting apparatus includes:

a power module 100 adapted to input a preset voltage into a DC-DC device 410 on a circuit board 400;

a frequency generating module 200 adapted to input a preset clock frequency signal into the DC-DC device 410; and a voltage detecting and determining module 300 adapted to detect soldering quality of the DC-DC device 410 on the circuit board 400 based on an output voltage of the DC-DC device 410.

Specifically, the output voltage of the DC-DC device 410 may be compared with a reference voltage by the voltage detecting and determining module 300, it is determined that the DC-DC device 410 is soldered normally if the output voltage is greater than the reference voltage, and it is determined that the DC-DC device 410 is soldered abnormally if the output voltage is not greater than the reference voltage.

In the DC-DC device soldering detecting apparatus according to the disclosure, the DC-DC device is taken as a booster device, which when being input with the preset voltage and colck frequency signal can output a corresponding voltage, and by comparing the output voltage of the DC-DC device and a reference voltage, it can be determined whether the DC-DC device operates normally, i.e., the soldering quality of the DC-DC device can be detected in the case where the circuit board is powered on, so as to detect the faulty soldering.

Figure 2:
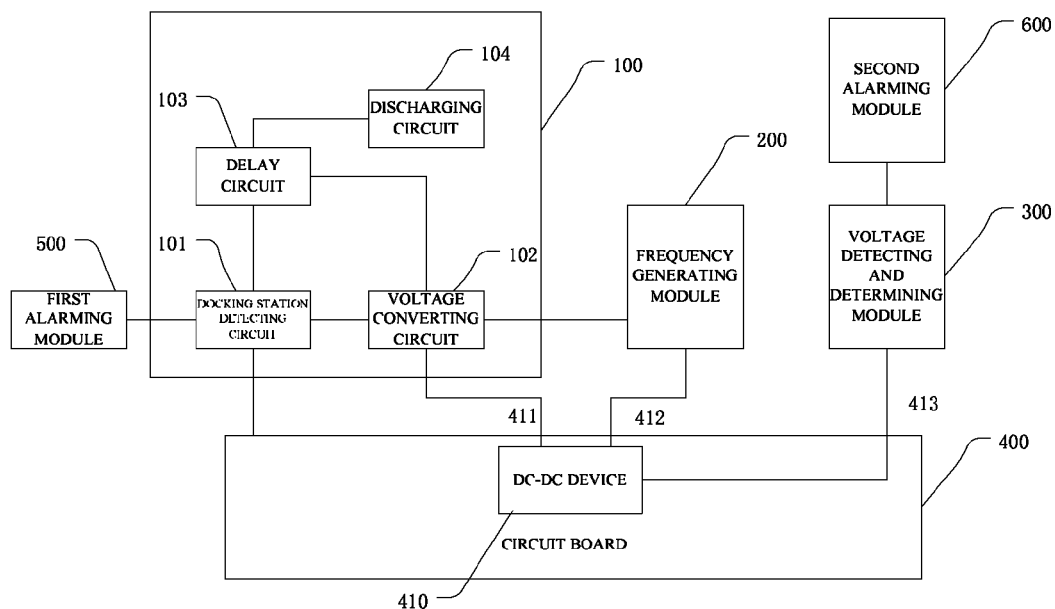
FIG. 2 is a schematic diagram of another DC-DC device soldering detecting apparatus according to an embodiment of the disclosure.

Referring to FIG. 2, in which a schematic diagram of another DC-DC device soldering detecting apparatus according to an embodiment of the disclosure is shown, the soldering detecting apparatus may include a power module 100, a frequency generating module 200 and a voltage detecting and determining module 300. The power module 100 may include a docking station detecting circuit 101 and a voltage converting circuit 102.

Figure 3:
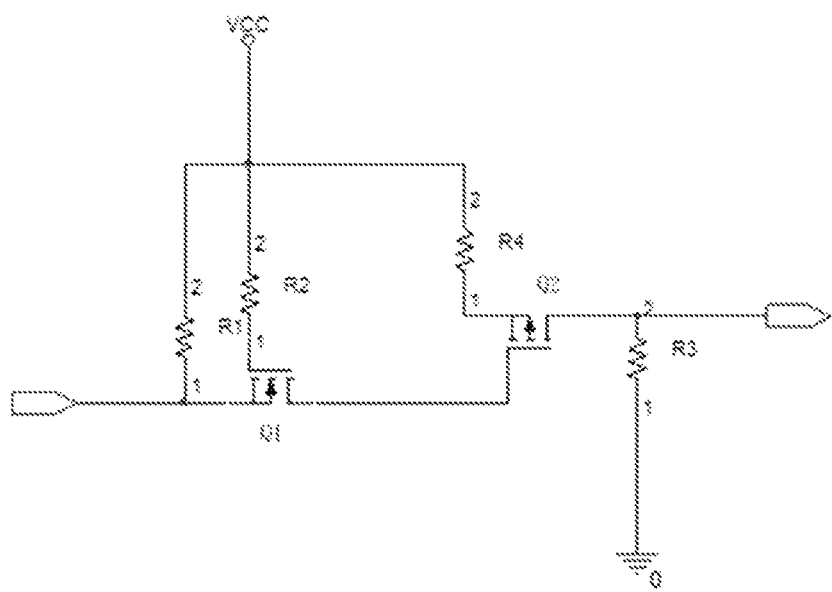
FIG. 3 is a schematic diagram of a docking station detecting circuit according to an embodiment of the disclosure.

The docking station detecting circuit 101 may be adapted to determine whether the soldering and positioning of the DC-DC device on the circuit board is correct based on a common ground signal of the circuit board, and send an ON-signal to the voltage converting circuit if the soldering and positioning of the DC-DC device on the circuit board is correct. Referring to FIG. 3, the docking station detecting circuit may include a first resistor R1, a second resistor R2, a third resistor R3, a fourth resistor R4, a first transistor Q1 and a second transistor Q2. An end of the first resistor R1 may be connected to a first end of the first transistor Q1; the other end of the first resistor R1 may be connected respectively to an end of the second resistor R2 and an end of the fourth resistor R4; the other end of the second resistor R2 may be connected to a gate electrode of the first transistor Q1; a second end of the second transistor Q2 may be connected to the other end of the fourth resistor R4; a first end of the second transistor Q2 may be connected to an end of the third resistor R3; a gate electrode of the second transistor Q2 may be connected to a second end of the first transistor Q1; the other end of the third transistor R3 may be grounded; and a first end of the first transistor Q1 may be connected to a common ground signal end on the circuit board, and may send an ON-signal via a second end of the second transistor Q2.

The voltage converting circuit 102 is adapted to input a preset voltage into the DC-DC device upon reception of the ON-signal, and control the frequency generating module and the voltage detecting and determining module to turn on.

Figure 4:
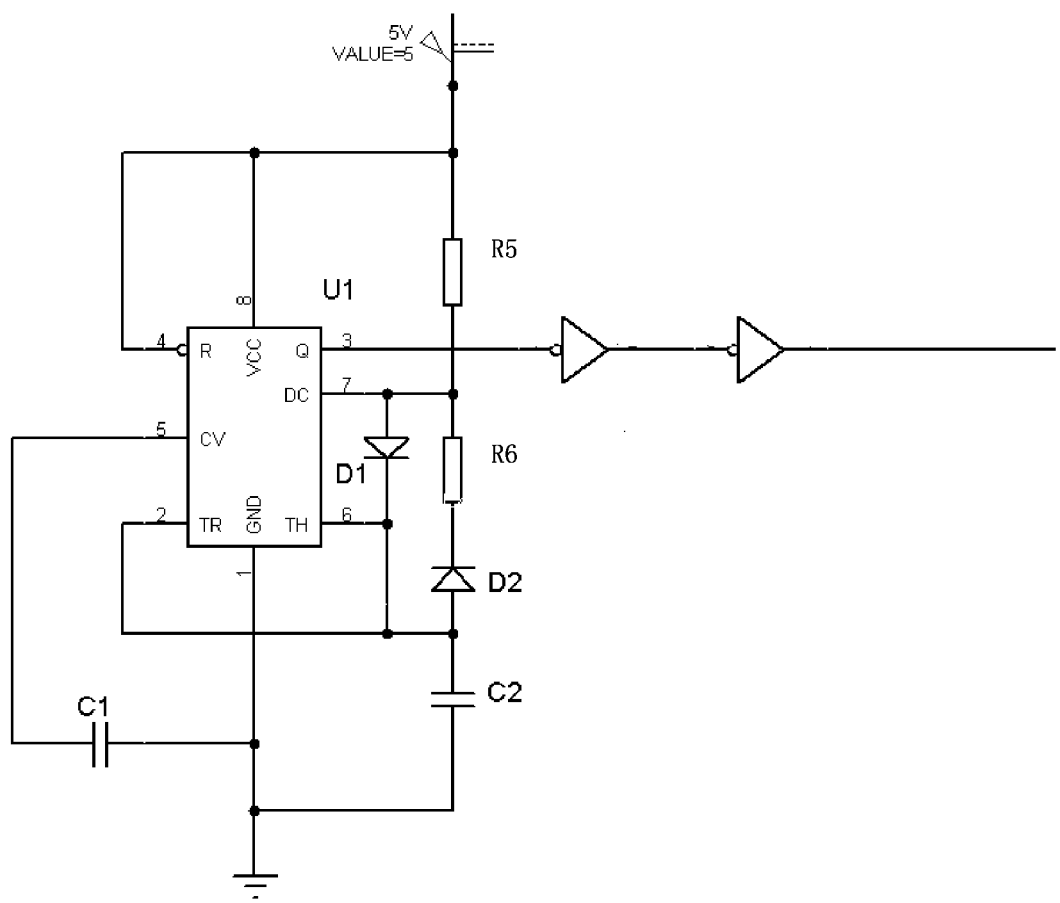
FIG. 4 is a schematic diagram of a frequency generating module according to an embodiment of the disclosure.

Referring to FIG. 4, the frequency generating module 200 may include a timer U1, a fifth resistor R5, a sixth resistor R6, a first diode D1, a second diode D2, a first capacitor C1 and a second capacitor C2. The timer U1 may be a 555 timer. A grounding pin (pin 1) of the timer U1 may be connected respectively to an end of the first capacitor C1 and an end of the second capacitor C2, and then grounded; a triggering pin (pin 2) of the timer U1 may be connected respectively to a threshold pin (pin 6) of the timer U1, a second end of the first diode D1, the other end of the second capacitor C2 and a first end of the second diode D2; a resetting pin (pin 4) of the timer U1 may be connected respectively to a powering pin (pin 8) of the timer U1, an end of the fifth resistor R5; a controlling pin (pin 5) of the timer U1 and the other end of the first capacitor; a discharging pin (pin 7) of the timer U1 may be connected respectively to the other end of the fifth resistor R5 and an end of the sixth resistor R6; and the other end of the sixth resistor R6 may be connected to a second end of the second diode D2. The pin 8 may be connected to the voltage converting circuit of the power module, and may input a preset clock frequency signal into the DC-DC device via the output pin (pin 3). Specifically, the frequency generating module is simply composed of a frequency generating circuit, which may generate a wave up to 1 MHz, for meeting the requirement of driving the DC-DC to work. In the embodiment of the disclosure, the main working principle of the frequency generating module 200 is as follows: a preset frequency square wave is generated by the 555 timer, the frequency and duty ratio of which can be set by adjusting the resistance value and capacitance value. Specifically, the frequency $$F = \frac{7}{10R_2C_2},$$

and the duty ratio $$Q = \frac{R_2}{R_1 + R_2}.$$

Figure 5:
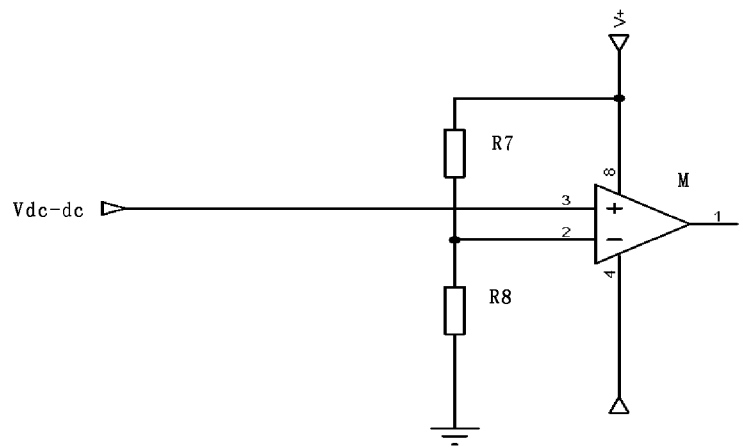
FIG. 5 is a schematic diagram of a voltage detecting and determining module according to an embodiment of the disclosure.

Upon detection of the output voltage of the DC-DC device, the voltage detecting and determining module 300 starts to perform the voltage determination and output parameters. The working principle is as follows: the output voltage of the DC-DC device is compared with the reference voltage by the voltage detecting and determining module 300 using the operational amplifier. Then 1 is outputted if the output voltage is greater than the reference voltage. And 0 is outputted if the output voltage is less than or equal to the reference voltage, and a second alarming module is locked and driven by using a data flip-flop (D trigger). Referring to FIG. 5, the voltage detecting and determining module 300 may include a seventh resistor R7, an eighth resistor R8 and an operational amplifier M. An end of the seventh resistor R7 may be connected respectively to an end of the eighth resistor R8 and an inverted inputting end of the operational amplifier M; the other end of the seventh resistor R7 may be connected to a positive power end of the operational amplifier M; the other end of the eighth resistor R8 may be grounded; and the non-inverting inputting end of the operational amplifier M is adapted to receive the output voltage Vdc-dc of the DC-DC device. In the embodiment of the disclosure, the voltage detecting and determining module is mainly composed of an operational amplifier, the reference voltage may be provided by power dividing, and the output voltage of the DC-DC device is compared with the reference voltage, for outputting a high/low level. Further, if a single DC-DC device has multiple outputs, the outputs can be inputted into the latch trigger by a TTL or AND circuit, and are inverted during the next detection.

Preferably, the power module may further include a delay circuit 103 and a discharging circuit 104.

Figure 6:
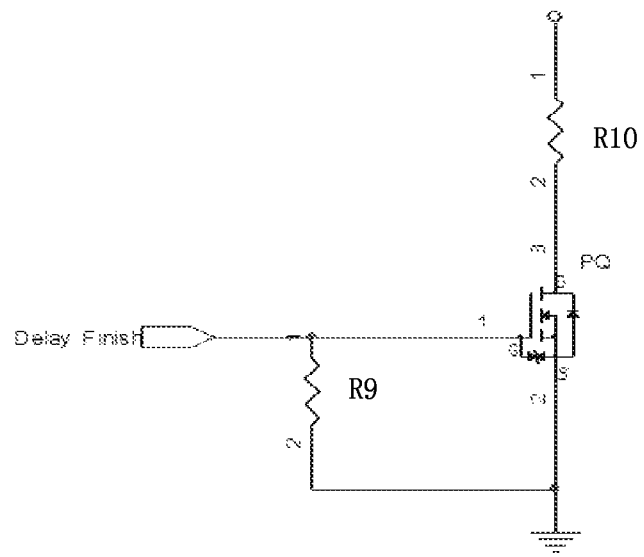
FIG. 6 is a schematic diagram of a discharging circuit according to an embodiment of the disclosure.

The delay circuit is adapted to provide a time delay when the docking station detecting circuit determines that the soldering and positioning of the DC-DC device on the circuit board is correct, and cause the circuit board and the DC-DC device to discharge with respect to the ground if the discharging circuit is controlled to turn on after the time delay is ended. Referring to FIG. 6, the discharging circuit may include a ninth resistor R9, a tenth resistor R10 and a metal-oxide-semiconductor field-effect transistor PQ. An end of the ninth resistor may be connected to a gate electrode of the metal-oxide-semiconductor field-effect transistor PQ; the other end of the ninth resistor may be connected to a source electrode of the metal-oxide-semiconductor field-effect transistor PQ and then grounded; and a drain electrode of the metal-oxide-semiconductor field-effect transistor PQ may be connected to an end of the tenth resistor R10. Specifically, when the delay of the delay circuit 104 is ended, the voltage converting circuit 102, the frequency generating module 200 and the voltage detecting and determining module 300 are turned off, and the discharging circuit 104 is turned on, so that the FPC and the DC-DC device are discharged with respect to the ground, for preventing the devices from being damaged by the electro-static discharge (ESD).

Figure 7:
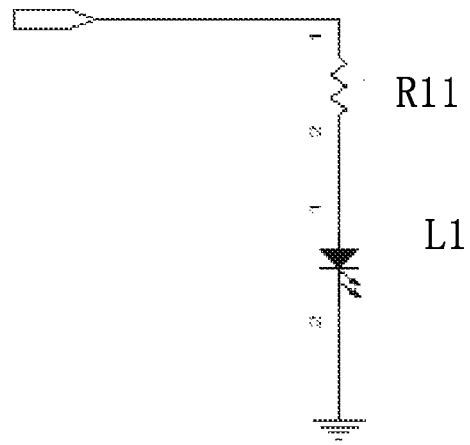
FIG. 7 is a schematic diagram of a first alarming module according to an embodiment of the disclosure.

Preferably, the above DC-DC device soldering detecting apparatus may futher include a first alarming module, the first alarming module may include a first LED light, which is turned on when the soldering and positioning of the DC-DC device on the circuit board is correct. For example, the first LED light may be a yellow LED light. Referring to FIG. 7, the first alarming module may include an eleventh resistor R11 and a yellow LED light L1.

Figure 8:
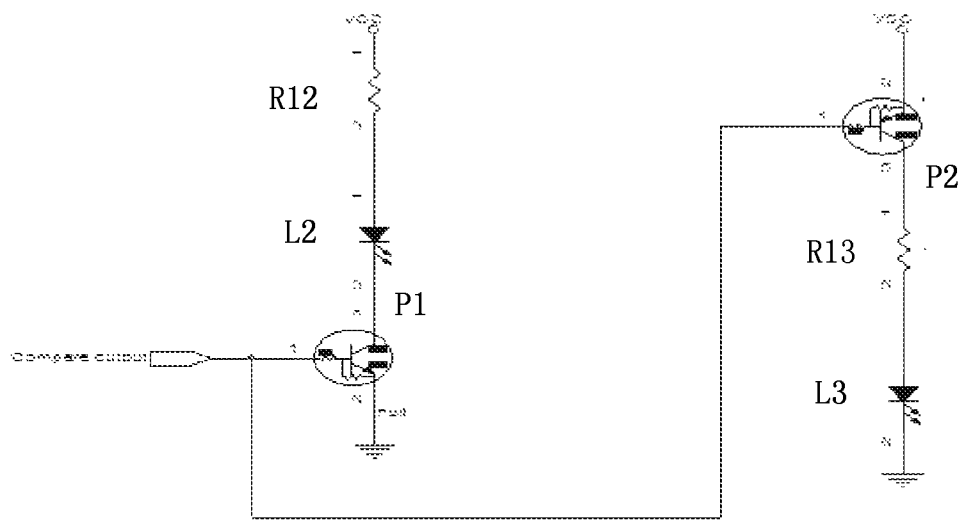
FIG. 8 is a schematic diagram of a second alarming module according to an embodiment of the disclosure.

Preferably, in order that the user can obtain the information about the soldering quality of the DC-DC device intuitively, a second alarming module may be further provided. The second alarming module may include a second LED light and a third LED light, with the second LED light being turned on when it is determined by the voltage detecting and determining module that the DC-DC device is soldered normally, and the third LED light being turned on when it is determined by the voltage detecting and determining module that the DC-DC device is soldered abnormally. For example, the second LED light may be a green LED light, and the third LED light may be a red LED light. Referring to FIG. 8, the second alarming module may include a first triode P1, a second triode P2, a twelveth resistor R12, a thirteenth resistor R13, a green LED light point L2 and a red LED light point L3. The first triode P1 may be connected to a first end of the second triode P2; a second end of the first triode P1 may be grounded; a third end of the first triode P1 may be connected to a second end of the green LED light point L2; a first end of the green LED light point L2 may be connected to an end of the twelveth resistor R12; a third end of the second triode P2 may be connected to an end of the thirteenth resistor R13; the other end of the thirteenth resistor R13 may be connected to a first end of the red LED light point L3; and a second end of the red LED light point L3 may be grounded.

With the DC-DC device soldering detecting apparatus according to the embodiment of the disclosure, the soldering quality of the DC-DC device on the circuit board can be detected. The circuit board may be a flexible circuit board (FPC), and in addition to the basic electrical detection of the FPC, the electrical detection of the DC-DC device on the FPC can be implemented by the detecting apparatus. The detecting apparatus may include a power module 100, a frequency generating module 200, a voltage detecting and determining module 300, a first alarming module 500 and a second alarming module 600. The main working process is as follow: the input signal of the DC-DC device includes a preset voltage input 411 and a clock frequency signal input 412, which are respectively provided by the power module 100 and the frequency generating module 200. The power module 100 and the frequency generating module 200 are connected to the input of the DC-DC device on the FPC via a holder. The common ground signal is detected by a docking station detecting circuit 101 of the power module 100, for achieving the position detecting of the detecting point and the switchnig function of the voltage converting circuit 102. Further, the detecting position state is displayed by the first alarming module. If the yellow LED light of the first alarming module is turned on, it indicates that the position is normal, and otherwise, the position is abnormal. After the docking station detecting circuit 101 detects that the position is correct, the frequency generating module 200 and the voltage detecting and determining module 300 are initialized by the voltage converting circuit 102 on the power module 100. And then a preset clock frequency signal 412 and a preset voltage 411 are inputted into the DC-DC device on the FPC by the power module 100 and the frequency generating module 200, so that the DC-DC device on the FPC works normally, and the output voltage 413 of the DC-DC device is fed back to the voltage detecting and determining module 300. The voltage detected by the voltage detecting and determining module 300 is compared with the reference voltage, and the result of the comparison is locked and inputted into the second alarming module 600. If the detected voltage is greater than the reference voltage, the output parameter is set as 1, for driving the green LED light in the second alarming module to turn on, which indicates that the soldering of the DC-DC device is normal for normal work. If the detected voltage is less than or equal to the reference voltage, the output parameter is set as 0, for driving the red LED light in the second alarming module to turn on, which indicates that the DC-DC device is not driven sufficiently, and the subsidiary circuits of the DC-DC device have faulty soldering, such as empty soldering or open circuit. After the detection is finished, the delay circuit 103 on the power module 100 is turned off, and the discharging circuit 104 on the power module 100 is turned on, for preventing the ESD from being damaged by the charge accumulation. In this way, the soldering state of the DC-DC device can be determined, and the faulty soldering can be detected and repaired based on the first determination.

The DC-DC device soldering detecting apparatus according to the embodiment of the disclosure includes a power module, a frequency generating module, a voltage detecting and determining module, a first alarming module and a second alarming module. The pins of the device are connected by the FPC leads, and input voltage and frequency are provided, for driving the DC-DC device to work, so as to determine whether the normal working voltage is outputted from the DC-DC device, thereby the solding state of the QFN packaged DC-DC device on the FPC can be detected by the detecting apparatus. The detecting apparatus is composed of hardware circuits completely, without software programming, which can be applied to a wider range of voltages, can be adjusted conveniently, for example, detecting and alarming for multiple products at the same time, and has higher efficiency and lower cost. In this detecting apparatus, automatic detection is performed after the position alignment, and alarming is performed by sound and light, thus the faulty soldering can be located accurately, for reducing detection missing rate. Further, due to the delay circuit, the detection time can be adjusted, and the discharging circuit can be added after the detection, for avoiding the damage caused by the ESD.

The above embodiments are only intended to describe the invention, but not to limit the invention. Various modifications and variations can be made by those skilled in the art without deviating from the spirit and scope of the invention. All the equivalent technical solutions fall within the scope of the invention, and the scope of protection of the invention is defined by the claims.

What is claimed is:

1. A direct current to direct current (DC-DC) device soldering detecting apparatus, comprising:
    a power module adapted to input a preset voltage into a DC-DC device on a circuit board;
    a frequency generating module adapted to input a preset clock frequency signal into the DC-DC device; and
    a voltage detecting and determining module adapted to compare an output voltage of the DC-DC device with a reference voltage, and to determine that the DC-DC device is soldered normally if the output voltage is greater than the reference voltage and determine that the DC-DC device is soldered abnormally if the output voltage is not greater than the reference voltage,
    wherein:
        the power module includes a docking station detecting circuit and a voltage converting circuit,
        the docking station detecting circuit is adapted to determine whether the soldering and positioning of the DC-DC device on the circuit board is correct based on a common ground signal of the circuit board, and send an ON-signal to the voltage converting circuit if the soldering and positioning of the DC-DC device on the circuit board is correct, and
        the voltage converting circuit is adapted to input the preset voltage into the DC-DC device upon reception of the ON-signal, and control the frequency generating module and the voltage detecting and determining module to turn on.

2. The apparatus according to claim 1, wherein:
    the docking station detecting circuit includes a first resistor, a second resistor, a third resistor, a fourth resistor, a first transistor, and a second transistor;

an end of the first resistor is connected to a first end of the first transistor;

the other end of the first resistor is connected respectively to an end of the second resistor and an end of the fourth resistor;

the other end of the second resistor is connected to a gate electrode of the first transistor;

a second end of the second transistor is connected to the other end of the fourth resistor;

a first end of the second transistor is connected to an end of the third resistor;

a gate electrode of the second transistor is connected to a second end of the first transistor; and the other end of the third resistor is grounded.

3. The apparatus according to claim 1, wherein:

the frequency generating module includes a timer, a fifth resistor, a sixth resistor, a first diode, a second diode, a first capacitor, and a second capacitor;

a grounding pin of the timer is connected respectively to an end of the first capacitor and an end of the second capacitor, and then grounded;

a triggering pin of the timer is connected respectively to a threshold pin of the timer, a second end of the first diode, the other end of the second capacitor, and a first end of the second diode;

a resetting pin of the timer is connected respectively to a powering pin of the timer, an end of the fifth resistor;

a controlling pin of the timer is connected to the other end of the first capacitor;

a discharging pin of the timer is connected respectively to the other end of the fifth resistor and an end of the sixth resistor; and the other end of the sixth resistor is connected to a second end of the second diode.

4. The apparatus according to claim 1, wherein the voltage detecting and determining module includes a seventh resistor, an eighth resistor, and an operational amplifier;

an end of the seventh resistor is connected respectively to an end of the eighth resistor and an inverted inputting end of the operational amplifier;

the other end of the seventh resistor is connected to a positive power end of the operational amplifier; and the other end of the eighth resistor is grounded.

5. The apparatus according to claim 1, wherein:

the power module further includes a delay circuit and a discharging circuit; and the delay circuit is adapted to provide a time delay when the docking station detecting circuit determines that the soldering and positioning of the DC-DC device on the circuit board is correct, and cause the circuit board and the DC-DC device to discharge with respect to ground if the discharging circuit is controlled to turn on after the time delay is ended.

6. The apparatus according to claim 5, wherein:

the discharging circuit includes a ninth resistor, a tenth resistor, and a metal-oxide-semiconductor field-effect, transistor (MOSFET);

an end of the ninth resistor is connected to a gate electrode of the MOSFET;

the other end of the ninth resistor is connected to a source electrode of the MOSFET and then grounded; and a drain electrode of the MOSFET is connected to an end of the tenth resistor.

7. The apparatus according to claim 1, further comprising a first alarming module, wherein the first alarming module includes a first light-emitting diode (LED) light, which is turned on when the soldering and positioning of the DC-DC device on the circuit board is correct.

8. The apparatus according to claim 1, further comprising a second alarming module, wherein the second alarming module includes a second LED light and a third LED light, with the second LED light being turned on when the voltage detecting and determining module determines that the DC-DC device is soldered normally, and the third LED light being turned on when the voltage detecting and determining module determines that the DC-DC device is soldered abnormally.

9. A method of using a direct current to direct current (DC-DC) device soldering detecting apparatus according to claim 1, the method comprising:

a voltage providing step adapted to input the preset voltage into the DC-DC device by using the power module;

a frequency signal providing step adapted to input the preset clock frequency signal into the DC-DC device by using the frequency generating module; and a voltage detecting and determining step adapted to compare the output voltage of the DC-DC device with the reference voltage, and to determine that the DC-DC device is soldered normally if the output voltage is greater than the reference voltage and determine that the DC-DC device is soldered abnormally if the output voltage is not greater than the reference voltage, wherein:

the voltage providing step includes a docking station detecting step and a voltage converting step, the docking station detecting step includes (i) determining whether the soldering and positioning of the DC-DC device on the circuit board is correct based on a common ground signal of the circuit board and (ii) if the soldering and positioning of the DC-DC device on the circuit board is determined to be correct, initializing the voltage converting step by using the docking station detecting circuit, and the voltage converting step includes (i) inputting the preset voltage into the DC-DC device upon reception of the ON-signal from the docking station detecting circuit and (ii) by using the voltage converting circuit, initializing the frequency signal providing step and the voltage detecting and determining step.

10. The method according to claim 9, wherein:

the docking station detecting circuit includes a first resistor, a second resistor, a third resistor, a fourth resistor, a first transistor, and a second transistor;

an end of the first resistor is connected to a first end of the first transistor;

the other end of the first resistor is connected respectively to an end of the second resistor and an end of the fourth resistor;

the other end of the second resistor is connected to a gate electrode of the first transistor;

a second end of the second transistor is connected to the other end of the fourth resistor;

a first end of the second transistor is connected to an end of the third resistor;

a gate electrode of the second transistor is connected to a second end of the first transistor; and the other end of the third resistor is grounded.

11. The method according to claim 9, wherein:

the frequency generating module includes a timer, a fifth resistor, a sixth resistor, a first diode, a second diode, a first capacitor, and a second capacitor;

a grounding pin of the timer is connected respectively to an end of the first capacitor and an end of the second capacitor, and then grounded;

a triggering pin of the timer is connected respectively to a threshold pin of the timer, a second end of the first diode, the other end of the second capacitor, and a first end of the second diode;

a resetting pin of the timer is connected respectively to a powering pin of the timer, an end of the fifth resistor;

a controlling pin of the timer is connected to the other end of the first capacitor;

a discharging pin of the timer is connected respectively to the other end of the fifth resistor and an end of the sixth resistor; and the other end of the sixth resistor is connected to a second end of the second diode.

12. The method according to claim 9, wherein:
the voltage detecting and determining module includes a seventh resistor, an eighth resistor, and an operational amplifier;

an end of the seventh resistor is connected respectively to an end of the eighth resistor and an inverted inputting end of the operational amplifier;

the other end of the seventh resistor is connected to a positive power end of the operational amplifier; and the other end of the eighth resistor is grounded.

13. The method according to claim 9, wherein:
the power module further includes a delay circuit and a discharging circuit; and the delay circuit is adapted to provide a time delay when the docking station detecting circuit determines that the soldering and positioning of the DC-DC device on the circuit board is correct, and cause the circuit board and the DC-DC device to discharge with respect to ground if the discharging circuit is controlled to turn on after the time delay is ended.

14. The method according to claim 13, wherein:
the discharging circuit includes a ninth resistor, a tenth resistor, and a metal-oxide-semiconductor field-effect transistor (MOSFET);

an end of the ninth resistor is connected to a gate electrode of the MOSFET;

the other end of the ninth resistor is connected to a source electrode of the MOSFET and then grounded; and a drain electrode of the MOSFET is connected to an end of the tenth resistor.

15. The method according to claim 9, further comprising a first alarming step,
wherein in the first alarming step, a first light-emitting diode (LED) light is turned on when the soldering and positioning of the DC-DC device on the circuit board is correct.

16. The method according to claim 9, further comprising a second alarming step,
wherein in the second alarming step, a second LED light is turned on when the voltage detecting and determining module determines that the DC-DC device is soldered normally, and a third LED light is turned on when the voltage detecting and determining module determines that the DC-DC device is soldered abnormally.

* * * * *